United States Patent
Baek et al.

(10) Patent No.: US 7,626,261 B2
(45) Date of Patent: Dec. 1, 2009

(54) WAFER STACKED PACKAGE HAVING VERTICAL HEAT EMISSION PATH AND METHOD OF FABRICATING THE SAME

(75) Inventors: Joong-Hyun Baek, Gyeonggi-do (KR); Hee-Jin Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/927,457

(22) Filed: Oct. 29, 2007

(65) Prior Publication Data

US 2008/0099909 A1 May 1, 2008

(30) Foreign Application Priority Data

Oct. 30, 2006 (KR) .................. 10-2006-0105628

(51) Int. Cl.
*H01L 23/34* (2006.01)
(52) U.S. Cl. ............... 257/714; 257/715; 257/E23.082; 257/E23.08; 257/E23.102; 257/E31.131
(58) Field of Classification Search ............... 257/714, 257/715, E23.082, E23.08, E23.102, E31.131
See application file for complete search history.

(56) References Cited

U.S. PATENT DOCUMENTS

| 6,236,568 B1 * | 5/2001 | Lai et al. .................. 361/704 |
| 6,251,707 B1 * | 6/2001 | Bernier et al. .............. 438/122 |
| 2003/0131968 A1 * | 7/2003 | Chrysler et al. ............ 165/48.1 |
| 2006/0197181 A1 * | 9/2006 | Noguchi ..................... 257/530 |

FOREIGN PATENT DOCUMENTS

| JP | 2001-156247 | 6/2001 |
| JP | 2001-168255 | 6/2001 |
| KR | 2000022292 A * | 4/2000 |

OTHER PUBLICATIONS

English language abstract of Japanese Publication No. 2001-156247.
English language abstract of Japanese Publication No. 2001-168255.

\* cited by examiner

*Primary Examiner*—A. Sefer
*Assistant Examiner*—Allen L Parker
(74) *Attorney, Agent, or Firm*—Volentine & Whitt, PLLC

(57) ABSTRACT

A wafer stacked semiconductor package (WSP) having a vertical heat emission path and a method of fabricating the same are provided. The WSP comprises a substrate on which semiconductor chips are mounted; a plurality of semiconductor chips stacked vertically on the substrate; a cooling through-hole formed vertically in the plurality of semiconductor chips, and sealed; micro holes formed on the circumference of the cooling through-hole; and a coolant filling the inside of the cooling through-hole. Accordingly, the WSP reduces a temperature difference between the semiconductor chips and quickly dissipates the heat generated by the stacked semiconductor chips.

13 Claims, 12 Drawing Sheets

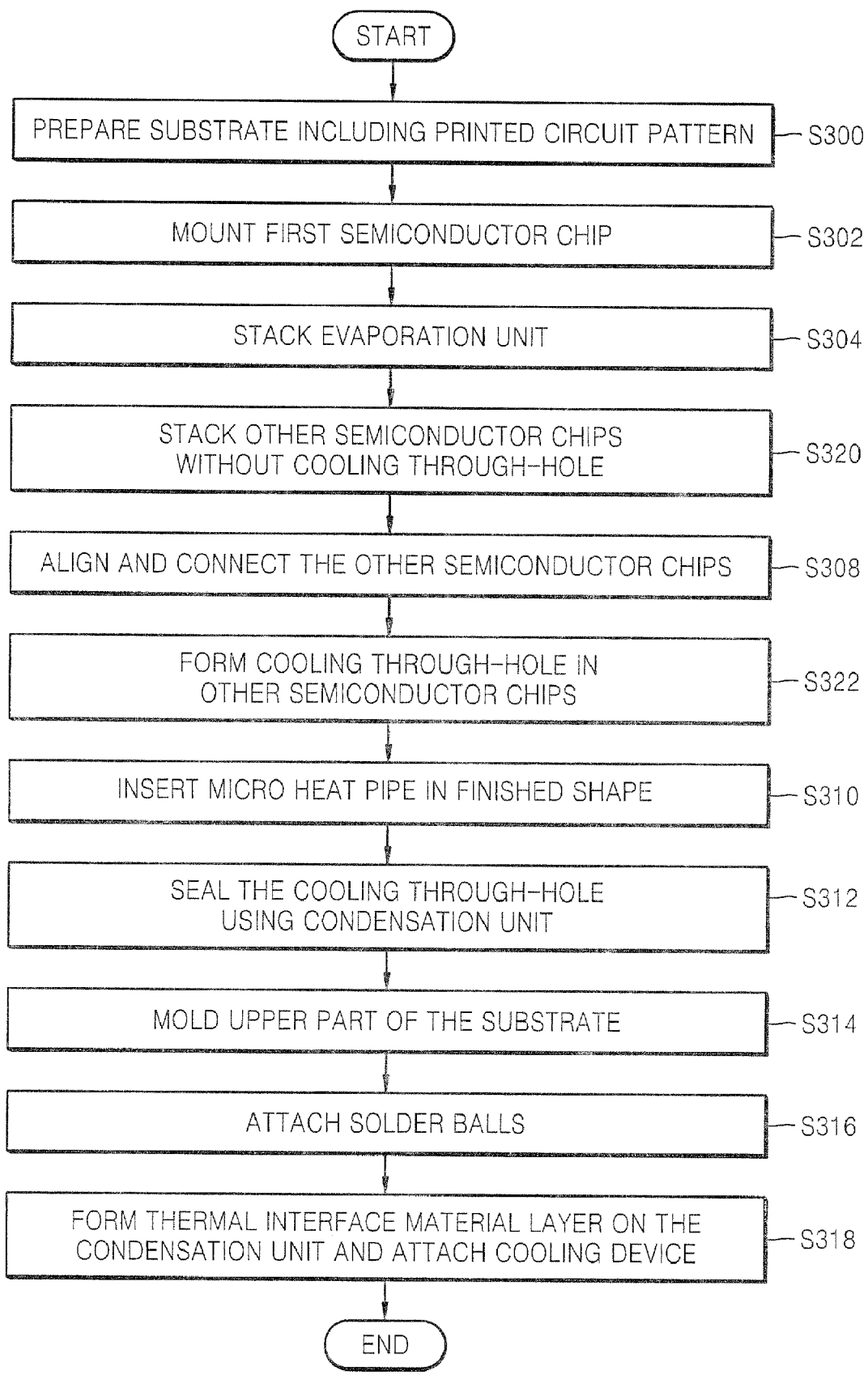

WAFER STACKED PACKAGE HAVING VERTICAL HEAT EMISSION PATH AND METHOD OF FABRICATING THE SAME

CROSS-REFERENCE TO RELATED PATENT APPLICATION

This application claims priority under 35 USC § 119 to Korean Patent Application No. 10-2006-0105628, filed on Oct. 30, 2006 in the Korean Intellectual Property Office, the disclosure of which is incorporated herein in its entirety by reference.

BACKGROUND

1. Technical Field

The present invention relates to a semiconductor package and a method of fabricating the same, and more particularly, to a wafer stacked package (WSP) having a vertical heat emission path inside a WSP semiconductor chip, and a method of fabricating the same.

2. Description of the Related Art

Conventionally, the usual method of fabricating a semiconductor memory device with high integration density is to apply the design rules of fabricating a thinner wafer and positioning many integrated circuits within the small area of the wafer, so that elements such as transistors and capacitors are three-dimensionally arranged. As an alternative, semiconductor devices are being developed to improve their integration density, by vertically stacking thinner semiconductor chips, so that many semiconductor chips are stacked within a single semiconductor package. The stacked semiconductor chip method for improving the integration density of a semiconductor memory device, using the semiconductor package fabricating technology, has many merits in the cost and time required for research and development and in realizing necessary processes, compared with the conventional method for improving the integrity density during the wafer fabrication process. Accordingly, significant research is directed towards the semiconductor package fabricating technology to improve the integration density of a semiconductor memory device.

In a semiconductor chip of a semiconductor memory device, such as a NAND flash memory device, many input/output pads (I/O pads) are placed in one area of the semiconductor chip. This can cause a 'hot spot' phenomenon when the NAND flash device operates at high speed. When a stack is formed of four or more chips with a relatively high power consumption, such as high-speed DDR DRAMs, a large amount of heat is generated. In a WSP particularly, the heat in the middle of the stack can not be effectively dissipated, since a significant amount of an adhesive is used for bonding the stack. The adhesive blocks the heat conduction between the stacked chips. This reduces the reliability of the WSP.

A system in package (SIP) has been the subject of significant research, as well. The SIP is a single integrated semiconductor package, manufactured by stacking a microprocessor or microcontroller semiconductor chip and a memory device semiconductor chip. However, for the SIP to be practical, a way must be found to effectively dissipate the great amount of heat generated by the microprocessor or microcontroller.

FIG. 1 is a sectional view for explaining a conventional WSP 50, and FIG. 2 is an enlargement of Part II of FIG. 1.

As illustrated in FIGS. 1 and 2, in the conventional WSP 50, four semiconductor chips 16 are stacked on a substrate 10 on which a printed circuit pattern is formed, and each semiconductor chip 16 is electrically connected to the substrate 10 under the semiconductor chips 16, by a via contact 18. In FIG. 1, reference numeral 20 indicates sealing resin for sealing the upper part of the substrate 10 and the semiconductor chips 16.

Electrical connection of the upper and lower semiconductor chips 16 is made by the via contact 18 composed of metal materials, as shown in FIG. 2. Regions of the semiconductor chips 16 other than those electrically connected by the via contacts 18 are physically connected by an adhesive 22.

FIG. 3 is a graph of simulated connection temperature vs. heat generated in two semiconductor chips in a WSP having four stacked semiconductor chips.

In FIG. 3, the WSP was cooled by natural convection currents, and the two semiconductor chips were at the top of a stack of four DDR DRAMs. The X axis indicates the power consumption of the two semiconductor chips, and the Y axis indicates the temperature. When the power consumption is 0.2 W or more, the temperature of the WSP is expected to be more than 85° C., which is the maximum temperature to guarantee reliability of the product. Also, when NAND flash products or microprocessor and memory products are stacked, the surface temperature of the semiconductor package is expected to be much higher, due to the hot-spot phenomenon and the great amount of heat generated by the microprocessor. Accordingly, a means for effectively dissipating the great amount of heat from the WSP is needed, to improve the reliability of the WSP.

SUMMARY

The present invention provides a wafer stacked semiconductor package (WSP) having a vertical heat emission path inside stacked semiconductor chips. The present invention also provides a method of fabricating the WSP having the vertical heat emission path.

According to an aspect of the present invention, there is provided a WSP having a vertical heat emission path, comprising: a substrate on which semiconductor chips are mounted; two or more semiconductor chips being vertically stacked on the substrate; an evaporation unit positioned on the lowest semiconductor chip being stacked; a cooling through-hole penetrating the second and subsequent semiconductor chips stacked on the evaporation unit; a condensation unit positioned on the top of the semiconductor chips and sealing an upper part of the cooling through-hole; and a coolant filling a cooling path sealed by the evaporation unit, the cooling through-hole and the condensation unit.

The vertical heat emission path reduces the heat buildup in the WSP due to the heat generated by the semiconductor chips and quickly dissipates a large amount of heat during the operation of the WSP. Consequently, the thermal reliability of the WSP is improved.

BRIEF DESCRIPTION OF THE DRAWINGS

The above and other features and advantages of the present invention will become more apparent by describing in detail exemplary embodiments thereof with reference to the attached drawings in which:

FIG. 17 is a process flow chart for explaining a method of fabricating a WSP having a vertical heat emission path, according to a modification example of the embodiment of FIG. 14.

DETAILED DESCRIPTION

The present invention will now be described more fully with reference to the accompanying drawings, in which preferred embodiments of the invention are shown. This invention may, however, be embodied in many different forms, and should not be construed as being limited to the embodiments set forth herein. Rather, these embodiments are provided so that this disclosure will be thorough and complete, and will fully convey the scope of the invention to those skilled in the art.

Figure 1:
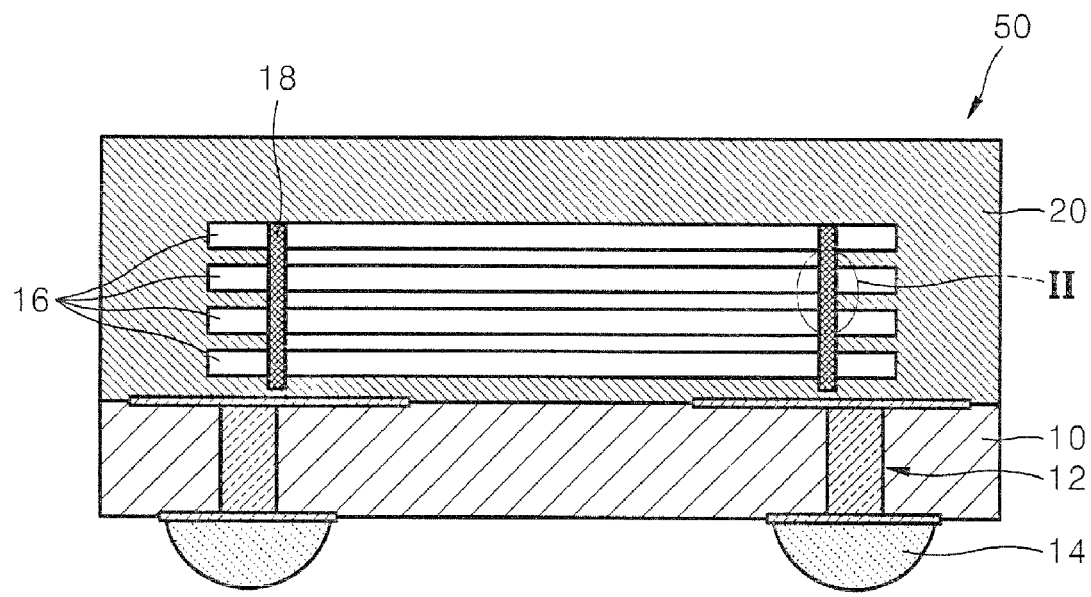
FIG. 1 is a sectional view for explaining a conventional wafer stacked semiconductor package (WSP)
Figure 2:
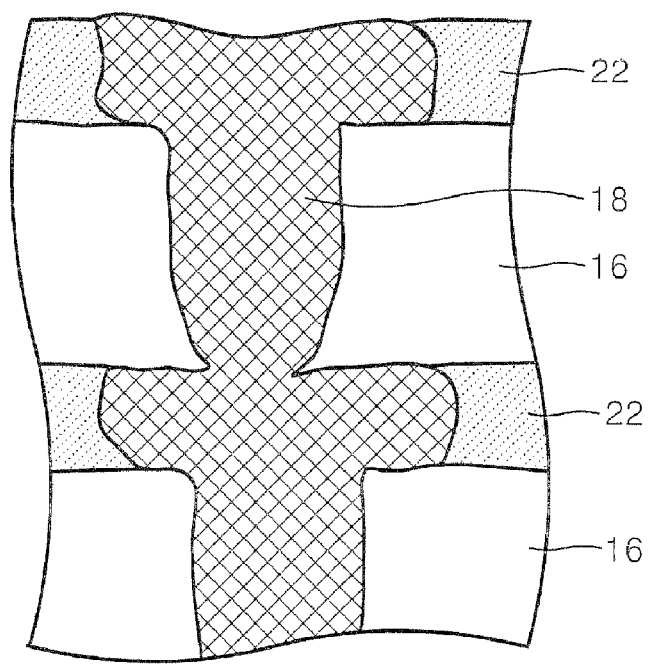
FIG. 2 is an enlargement of Part II of FIG. 1.
Figure 3:
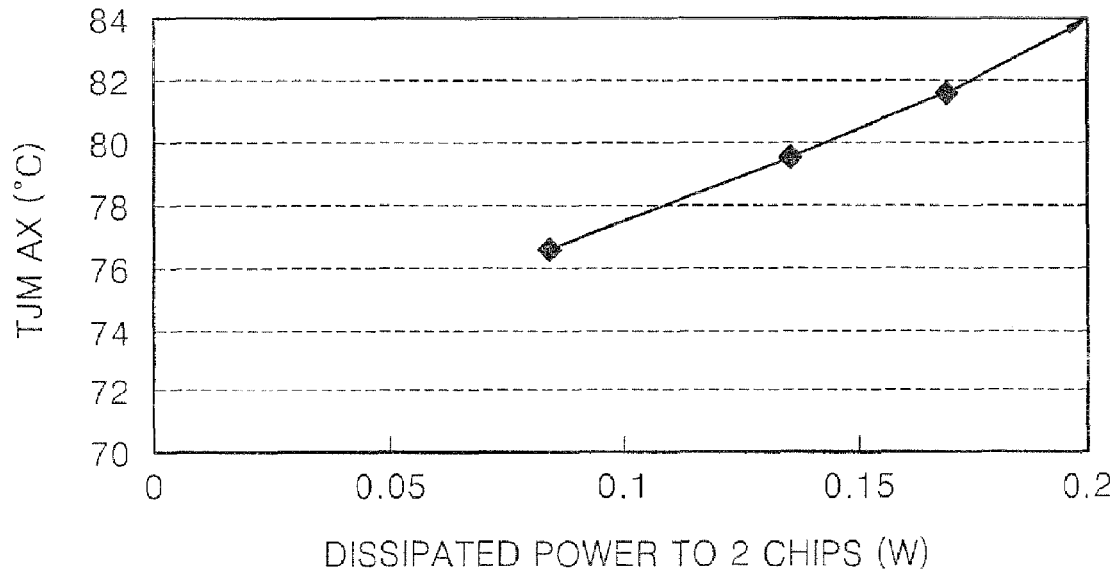
FIG. 3 is a graph of simulated connection temperature vs. heat generated in two semiconductor chips in a WSP having four stacked semiconductor chips.
Figure 4:
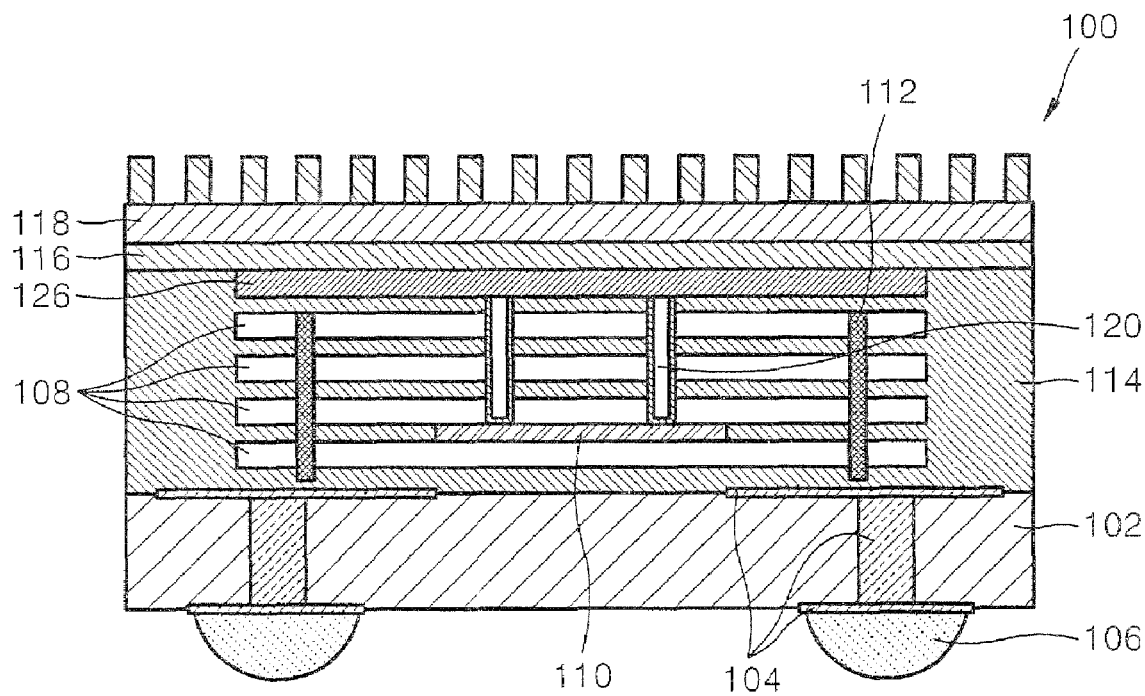
FIG. 4 is a sectional view of a WSP having a vertical heat emission path according to an embodiment of the present invention.

FIG. 4 is a sectional view of a wafer stacked semiconductor package (WSP) having a vertical heat emission path, according to an embodiment of the present invention.

As illustrated in FIG. 4, the WSP 100 comprises: a substrate 102 on which a printed circuit pattern 104 is formed, a plurality of semiconductor chips 108 mounted vertically on the substrate 102, a cooling through-hole 120 formed vertically through the plurality of semiconductor chips 108 and sealed, a micro hole (122 of FIG. 7) formed on the circumference of the cooling through-hole 120 and sealed, and a coolant (130 of FIG. 6) filling the inside of the cooling through-hole 120.

The coolant 130 inside the cooling through-hole 120 is sealed by an evaporation unit 110 and a condensation unit 126, which each may take the form of a metal plate. The evaporation unit 110 and the condensation unit 126 may be manufactured of copper, since it is a metal and has high thermal conductivity. The coolant 130 is a liquid which is capable of evaporating and condensing, and may be water, Freon gas, or other materials. The coolant 130 fills 30 to 90% of the inside volume of the cooling through-hole 120, and the remaining portion may be in a vacuum.

Accordingly, a vertical heat emission path is formed, which allows a great amount of heat generated in the semiconductor chips 108 to be quickly transferred to the condensation unit 126, which is exposed to the outside of the WSP 100, through the evaporation and condensation of the coolant 130. The condensation unit 126 may additionally include a thermal interface material layer (TIM) 116 and a cooling device 118 on the condensation unit 126, to maximize the heat emission to the outside.

The cooling device 118 may use any structure capable of quickly emitting heat from the condensation unit 126 to the air. For example, a heat spreader, a heat sink, a material producing a Peltier effect, and a cooling fan may be generally used as the cooling device 118. Each of the semiconductor chips 108 may be a memory device, a microprocessor or a microcontroller. The bottom surface of the semiconductor chips 108 is polished, and thus the thickness of the semiconductor chips 108 may be about 10 to 90 ρm, to reduce the total thickness of the WSP 100.

In FIG. 4, reference numeral 114 indicates sealing resin for sealing the upper part of the substrate 102 and the semiconductor chips 108, reference numeral 106 indicates a solder ball attached to the lower part of the substrate 102, and reference numeral 112 indicates a via contact.

Figure 5:
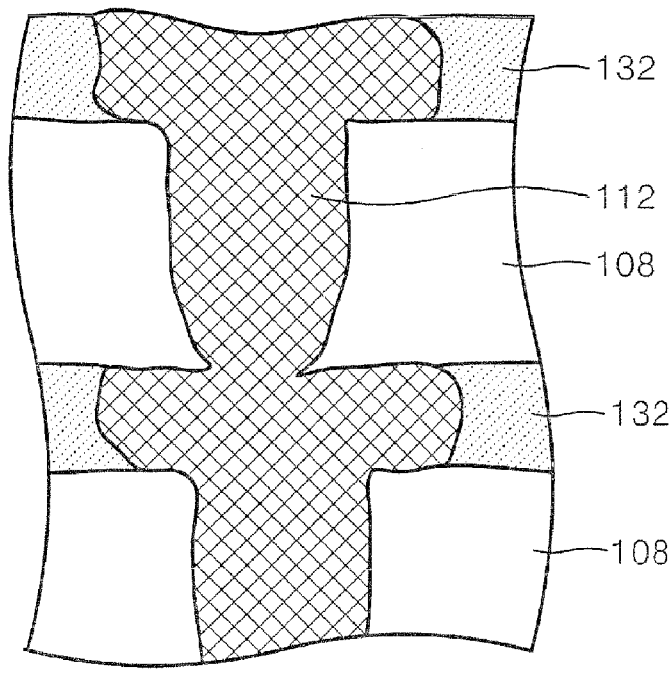
FIG. 5 is an enlargement of a via contact of FIG. 4.

FIG. 5 is an enlargement of the via contact 112 of FIG. 4.

As illustrated in FIG. 5, the stack of semiconductor chips 108 have a plurality of via contacts 112. The via contacts 112 penetrate the semiconductor chips 108 and are electrically connected to the substrate 102. The number of via contacts 112 corresponds to the number of pads formed on the semiconductor chips 108. The via contacts 112 are composed of a metal material with high conductivity and are an electrical connection path between the upper and lower semiconductor chips 108. The regions of the upper and lower semiconductor chips 108 other than those electrically connected by the via contacts 112 are connected by an adhesive 132 as shown.

Figure 6:
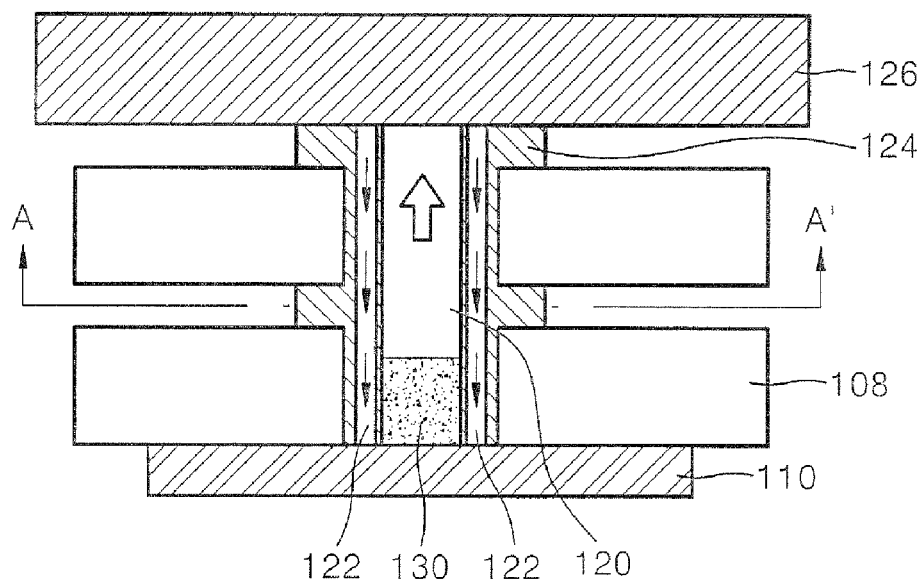
FIG. 6 is a sectional view illustrating the operating principle of the vertical heat emission path of FIG. 4.
Figure 7:
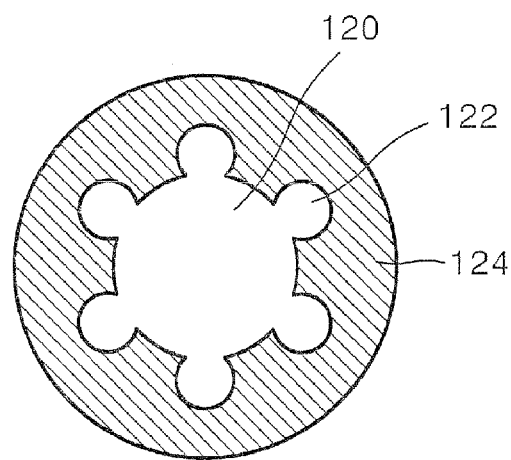
FIG. 7 is a sectional view taken along Line A-A' of FIG. 6.
Figure 8:
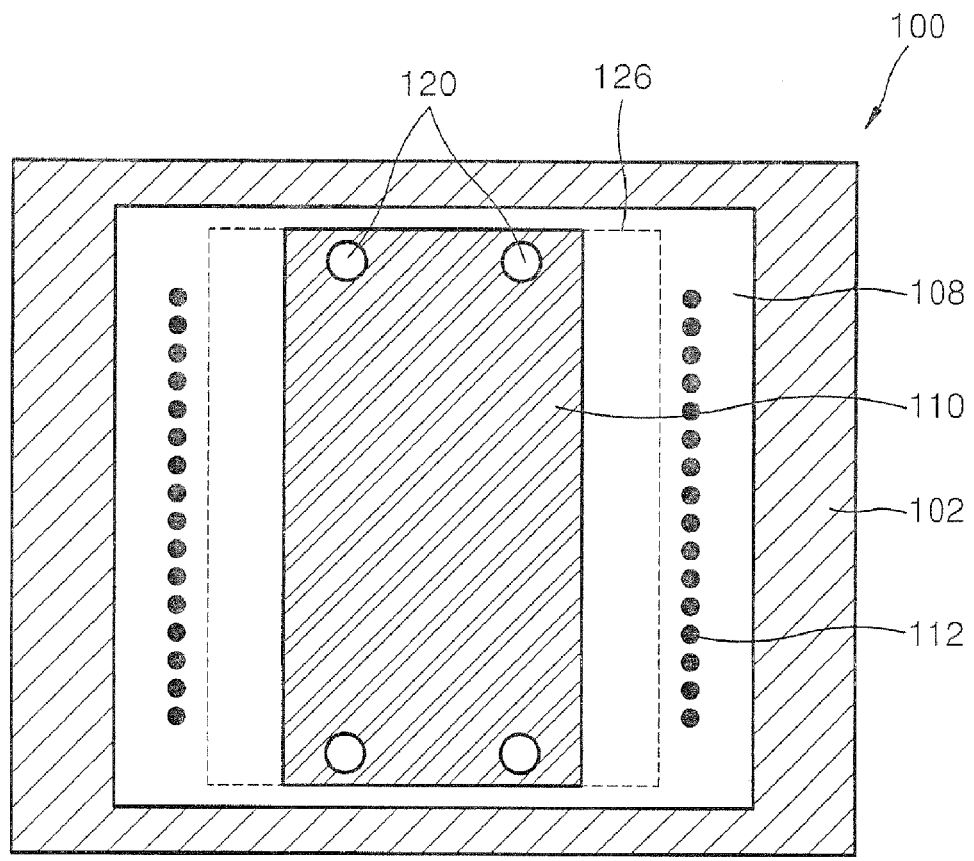
FIG. 8 is a plan view illustrating the position of a cooling through-hole in a semiconductor chip.

FIG. 6 is a sectional view illustrating the operating principle of the vertical heat emission path of FIG. 4, FIG. 7 is a sectional view taken along Line A-A' of FIG. 6, and FIG. 8 is a plan view illustrating the position of the cooling through-hole 120 of the semiconductor chip.

Referring to FIGS. 6 through 8, the operating principle of the vertical heat emission path of the WSP according to the embodiment of the present invention will now be described. As illustrated in FIG. 6, the sidewalls of the vertical heat emission path are sealed by the cooling through-hole 120 of the semiconductor chips 108, the lower part thereof is sealed by the evaporation unit 110, and the upper part thereof is sealed by the condensation unit 126. A metal layer 124 is formed on the sidewalls and the upper part of the cooling through-hole 120 of the semiconductor chips 108. The coolant 130, for example, water, is vaporized into steam by the heat of the evaporation unit 110 and moves up in the direction of the large arrow indicated in FIG. 6. Then, the vaporizing coolant 130 is cooled by the condensation unit 126 and condenses to become water again. The liquid coolant 130 flows into the micro holes 122 formed on the circumference of the cooling through-hole 120 and moves down in the direction of the small arrows indicated in FIG. 6. While these processes are repeated, heat is removed from the evaporation unit 110 and the semiconductor chips 108 positioned on the evaporation unit 110 by the coolant 130. Accordingly, even if a hot spot occurs in the stacked semiconductor chips 108 or even if semiconductor chips such as a microprocessor or a microcontroller generate a great amount of heat, the heat is quickly transferred to the outside through the vertical heat emission path. The vertical heat emission path has thermal conductivity characteristics one hundred times greater or more than the conventional structure in which the heat of the semiconductor chips is dissipated using the thermal conductivity of copper.

As illustrated in FIG. 8, the cooling through-hole 120 which forms the vertical heat emission path is positioned in the 'hot spot' region where most heat is generated inside the semiconductor chips 108, thereby effectively reducing the temperature variation inside the semiconductor chips 108.

Figure 9:
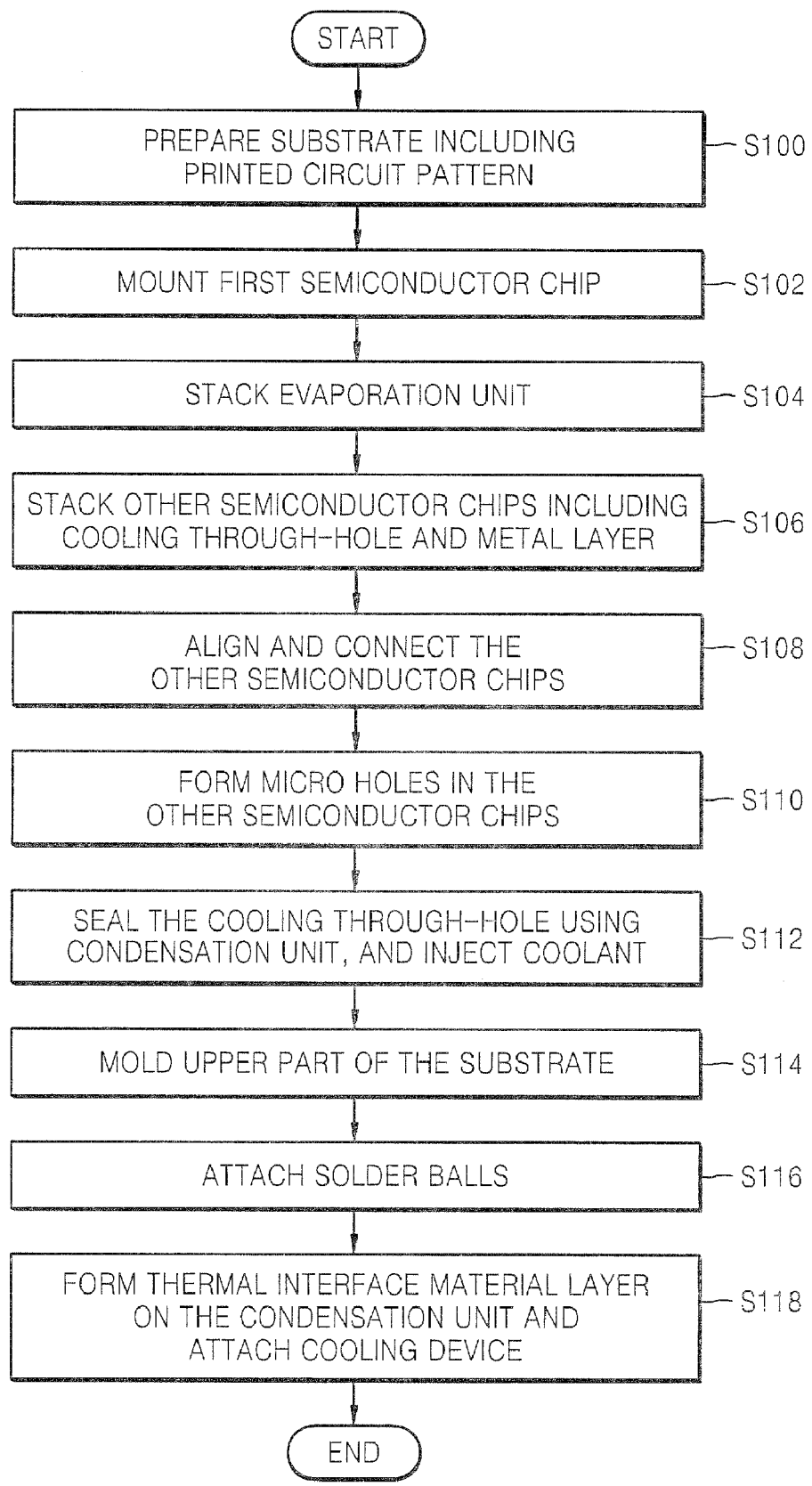
FIG. 9 is a process flow chart illustrating a method of fabricating a WSP having a vertical heat emission path, according to another embodiment of the present invention.
Figure 10:
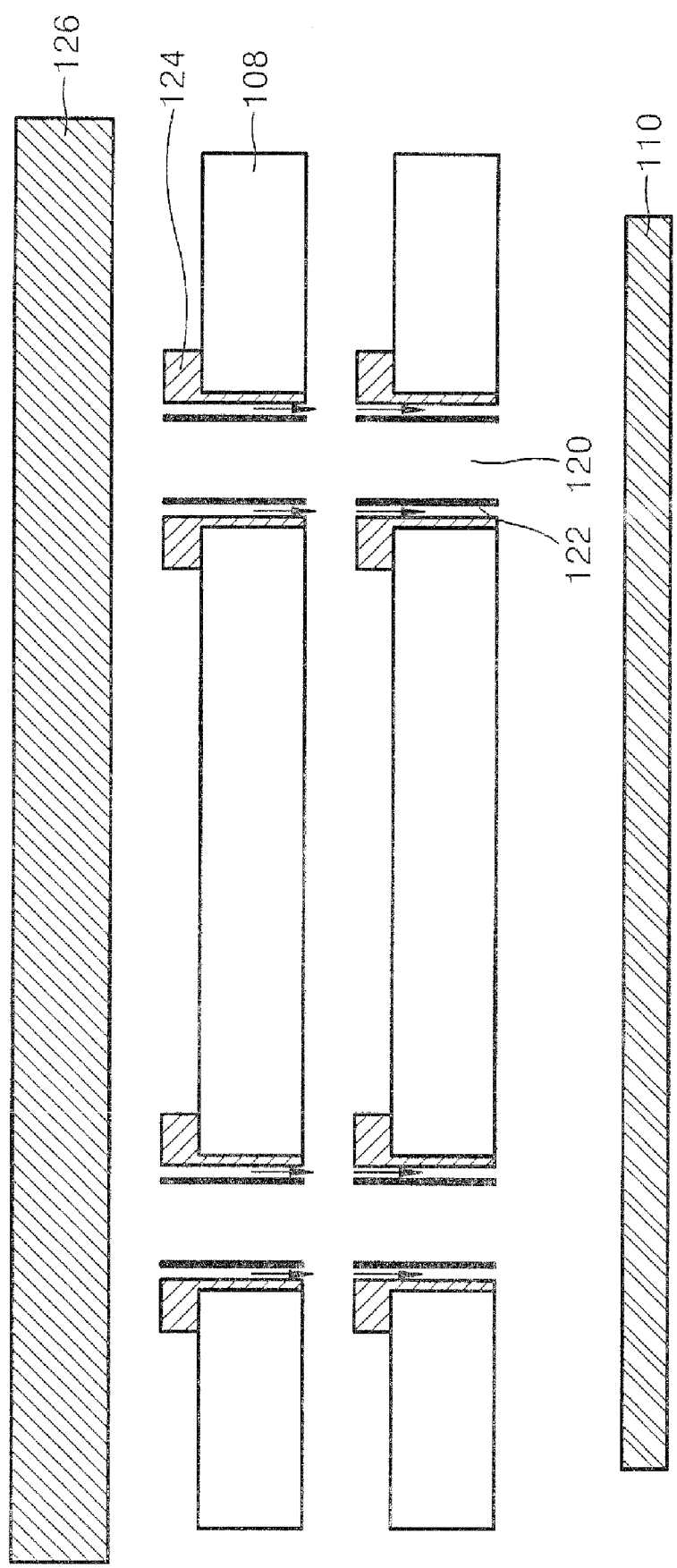
FIG. 10 is a sectional view of the heat emission path formed according to the embodiment of FIG. 9.

FIG. 9 is a process flow chart illustrating a method of fabricating a WSP having a vertical heat emission path, according to another embodiment of the present invention, and FIG. 10 is a sectional view of the heat emission path formed according to the embodiment of FIG. 9.

Referring to FIGS. 9 and 10, in the WSP having the vertical heat emission path the cooling through-hole 120 and the stacked semiconductor chips 108 are connected by the metal layer 124, which may comprise copper. The top semiconductor chip 108 and the condensation unit 126 are also connected by the metal layer 124.

The method of fabricating the WSP having the vertical heat emission path will be described below: A substrate 102 for a ball grid array (BGA) including a printed circuit pattern 104 is prepared (S100). A printed circuit pattern 104 for connecting a via contact 112 may be prepared within the substrate 102. A first semiconductor chip which has no cooling through-hole is mounted to be electrically connected to the substrate 102 (S102). The first semiconductor chip may be mounted so that the circuit surface faces down or up. Subsequently, an evaporation unit 110 is stacked in the area of the first semiconductor chip where heat emission is relatively great (S104). Other semiconductor chips 108, for example, a plurality of semiconductor chips 108 within which the cooling through-hole 120 is formed, are aligned and stacked on the resultant structure including the evaporation unit 110 (S106). The via contact 112 may be formed inside the first semiconductor chip or the other semiconductor chips 108.

The cooling through-hole 120 may be formed by LASER drilling or etching. In the other semiconductor chips, the metal layer 124 is formed in and around the cooling through-hole 120. The metal layer 124 is composed of copper and may be formed by chemical vapor deposition (CVD) or physical vapor deposition (PVD).

Subsequently, the stacked semiconductor chips 108 are aligned so that the cooling through-hole 120 is connected vertically inside the semiconductor chips 108. Then, the sidewall of the cooling through-hole 120 in the vertically aligned semiconductor chips 108 is sealed by performing metal connection at a low temperature of 200° C. or less (S108). Subsequently, a plurality of micro holes 122 are formed around the circumference of the cooling through-hole 120 inside the stacked semiconductor chips 108 (S110). The diameter of the micro holes 122 may be smaller than that of the cooling through-hole 120. The micro holes 122 may be formed by LASER drilling. The cooling through-hole 120 and the micro holes 122 may vary in shape, but are generally round to reduce the physical resistance during LASER drilling.

Subsequently, the cooling through-hole 120 with the micro holes 122 is sealed by a condensation unit 126, for example, a copper plate on the top of the stacked semiconductor chips 108, and a coolant 130, such as water, is injected to fill 30 to 90% of the cooling through-hole 120 (S112). After the coolant 130 is injected, the inside of the cooling through-hole 120 may be maintained in a vacuum state.

Then, the upper part of the substrate 102 and the semiconductor chips 108 are sealed by a molding process using sealing resin 114 (S114), and a solder ball 106 is attached below the substrate 102 (S116). The molding process may be performed so that the upper part of the condensation unit 126 is exposed outside the sealing resin 114, and subsequently a thermal interface material layer 116 and a cooling device 118 are attached to the condensation unit 126 (S118).

Figure 11:
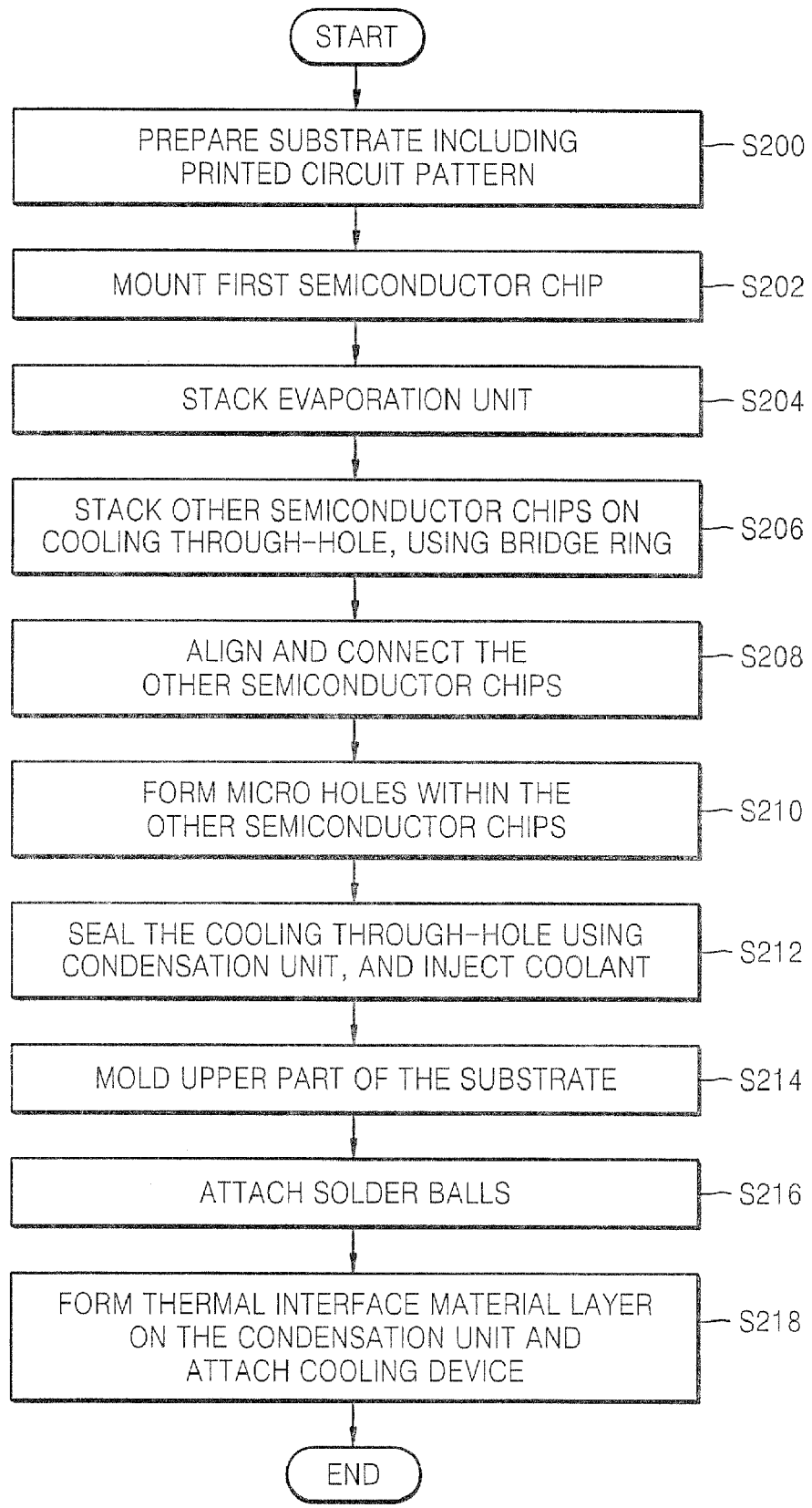
FIG. 11 is a process flow chart illustrating a method of fabricating a WSP having a vertical heat emission path, according to yet another embodiment of the present invention.
Figure 12:
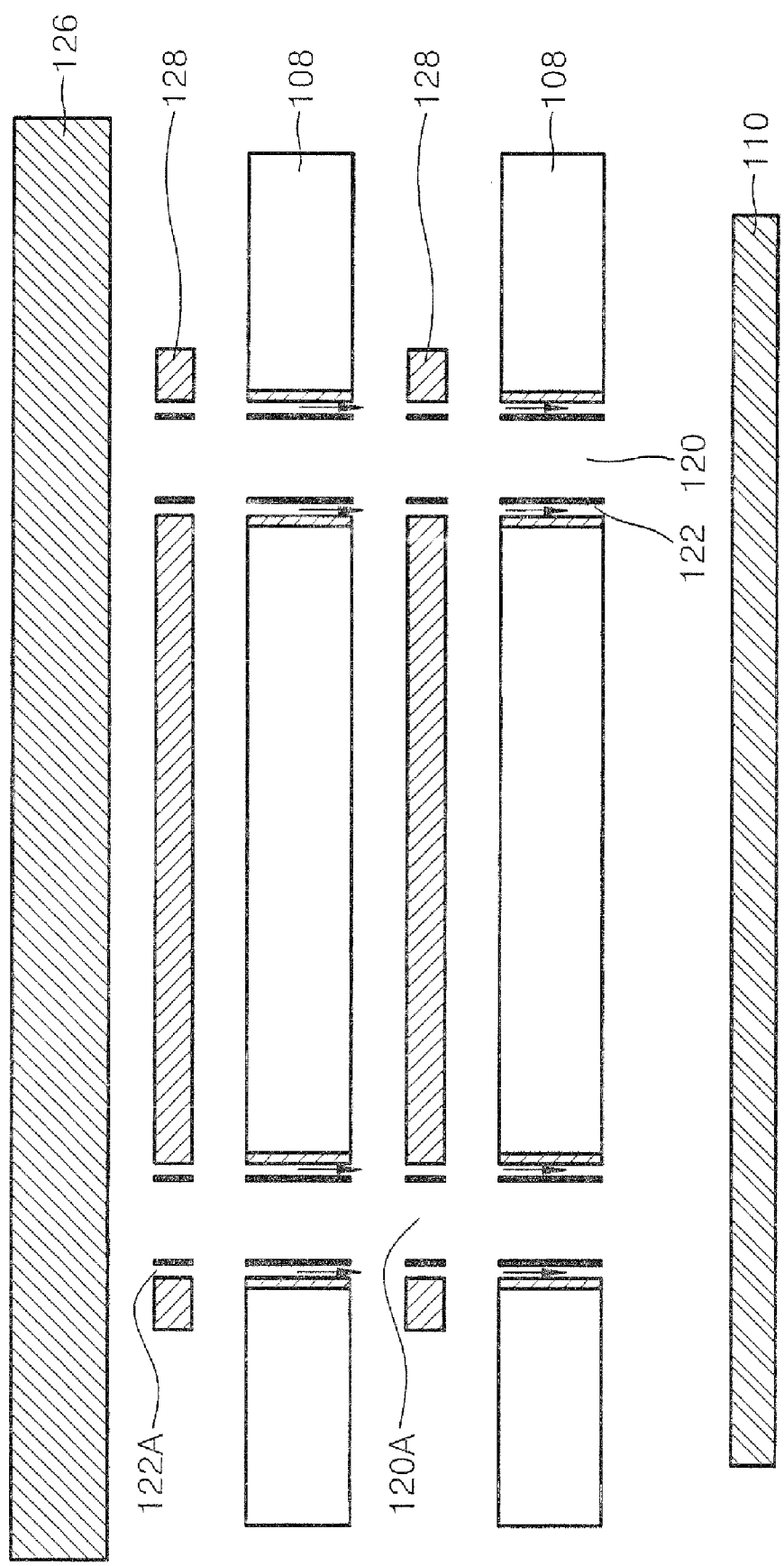
FIG. 12 is a sectional view of the heat emission path formed according to the embodiment of FIG. 11.
Figure 13:
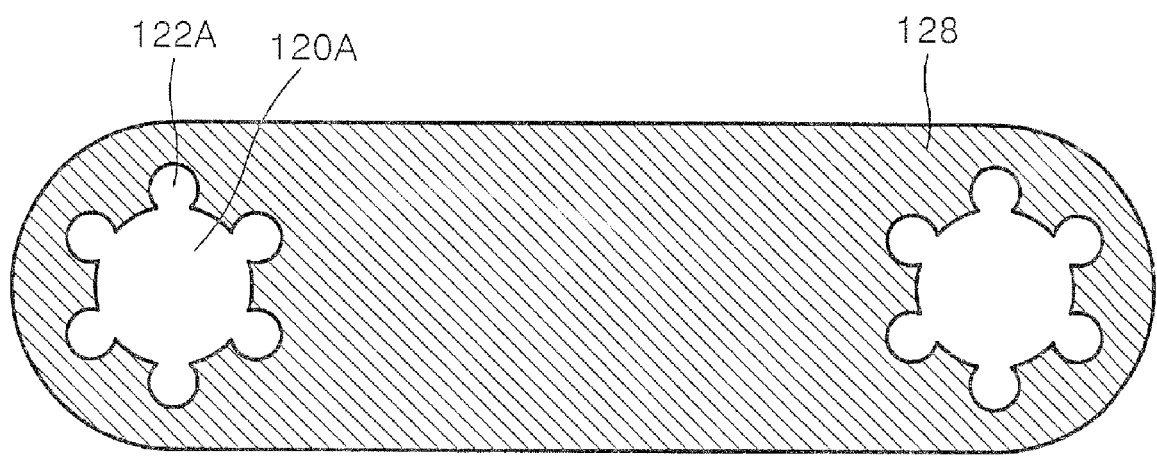
FIG. 13 is a plan view of a bridge ring used in FIG. 12.

FIG. 11 is a process flow chart illustrating a method of fabricating a WSP having a vertical heat emission path, according to yet another embodiment of the present invention, FIG. 12 is a sectional view of a heat emission path formed according to the embodiment of FIG. 11, and FIG. 13 is a plan view of a bridge ring used in FIG. 12.

Referring to FIGS. 11 through 13, in the WSP according to this embodiment, a cooling through-hole 120 and stacked semiconductor chips 108 are connected by a bridge ring 128. In addition, a top semiconductor chip 108 and a condensation unit 126 are connected by the bridge ring 128. The bridge ring 128 includes a cooling through-hole 120A and micro holes 122A, similar to the cooling through-hole 120 and micro holes 122 formed inside the semiconductor chips 108, as shown FIG. 13. The bridge ring 128 may be composed of an insulating material, such as polyimide. The bridge ring 128 may use other materials, considering durability and the thermal expansion characteristics of the other materials, if necessary.

To fabricate the WSP having the vertical heat emission path according to this embodiment, a substrate 102 for the BGA including a printed circuit pattern 104 is prepared (S200). A first semiconductor chip having no cooling through-hole is mounted to be electrically connected to the substrate 102 (S202).

Subsequently, an evaporation unit 110 is stacked on the first semiconductor chip (S204). Other semiconductor chips 108, for example, a plurality of semiconductor chips 108 in which the cooling through-hole 120 is formed, are aligned and stacked on the resultant structure having the evaporation unit 110 (S206), using a bridge ring 128 in the structure shown in FIG. 13. A via contact 112 may be formed inside the first semiconductor chip or the other semiconductor chips 108.

Subsequently, the stacked semiconductor chips 108 and the bridge ring 128 are aligned so that the cooling through-holes 120 and 120A are connected vertically. Then, the connection of the semiconductor chips 108 and the bridge ring 128 is performed (S208). Accordingly, the sidewall of the cooling through-hole 120 in the stacked semiconductor chips 108 is sealed by the bridge ring 128 and the other semiconductor chips 108.

Subsequently, a plurality of micro holes 122 are formed around the circumference of the cooling through-hole 120 inside the stacked semiconductor chips 108 (S210). The diameter of the micro holes 122 may be smaller than that of the cooling through-hole 120. The micro holes 122 may be formed by LASER drilling.

Subsequently, after the bridge rings 128 are aligned on the top of the stacked semiconductor chips 108, the cooling through-hole 120 with the micro holes 122 is sealed by the condensation unit 126, and a coolant 130, such as water, is injected to fill 30 to 90% of the cooling through-hole 120 (S212). After the coolant 130 is injected, the inside of the cooling through-hole 120 may be maintained in a vacuum state.

Then, the upper part of the substrate 102 and the semiconductor chips 108 are sealed by a molding process using sealing resin 114 (S214), and a solder ball 106 is attached below the substrate 102 (S216). The molding process may be performed so that the upper part of the condensation unit 126 is exposed outside the sealing resin 114, and subsequently a thermal interface material layer 116 and a cooling device 118 are attached to the condensation unit 126 (S218).

Figure 14:
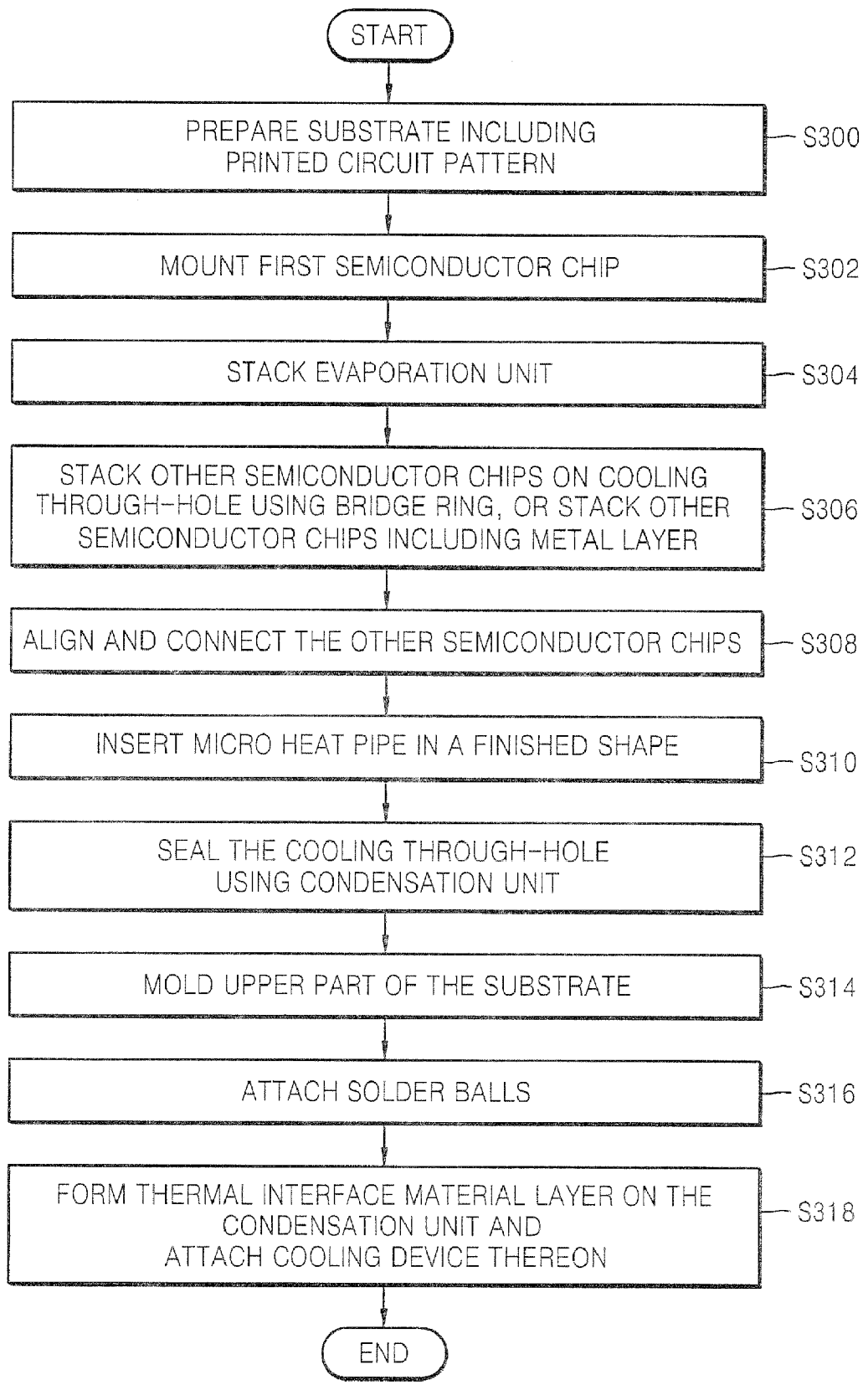
FIG. 14 is a process flow chart illustrating a method of fabricating a WSP having a vertical heat emission path, according to still another embodiment of the present invention.
Figure 15:
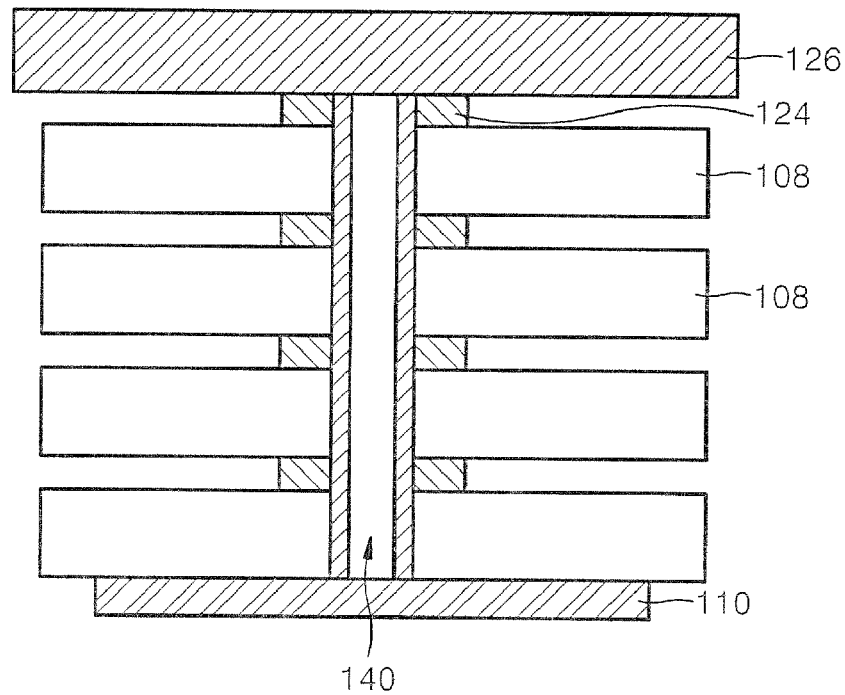
FIG. 15 is a sectional view of the heat emission path formed according to the embodiment of FIG. 14.
Figure 16:
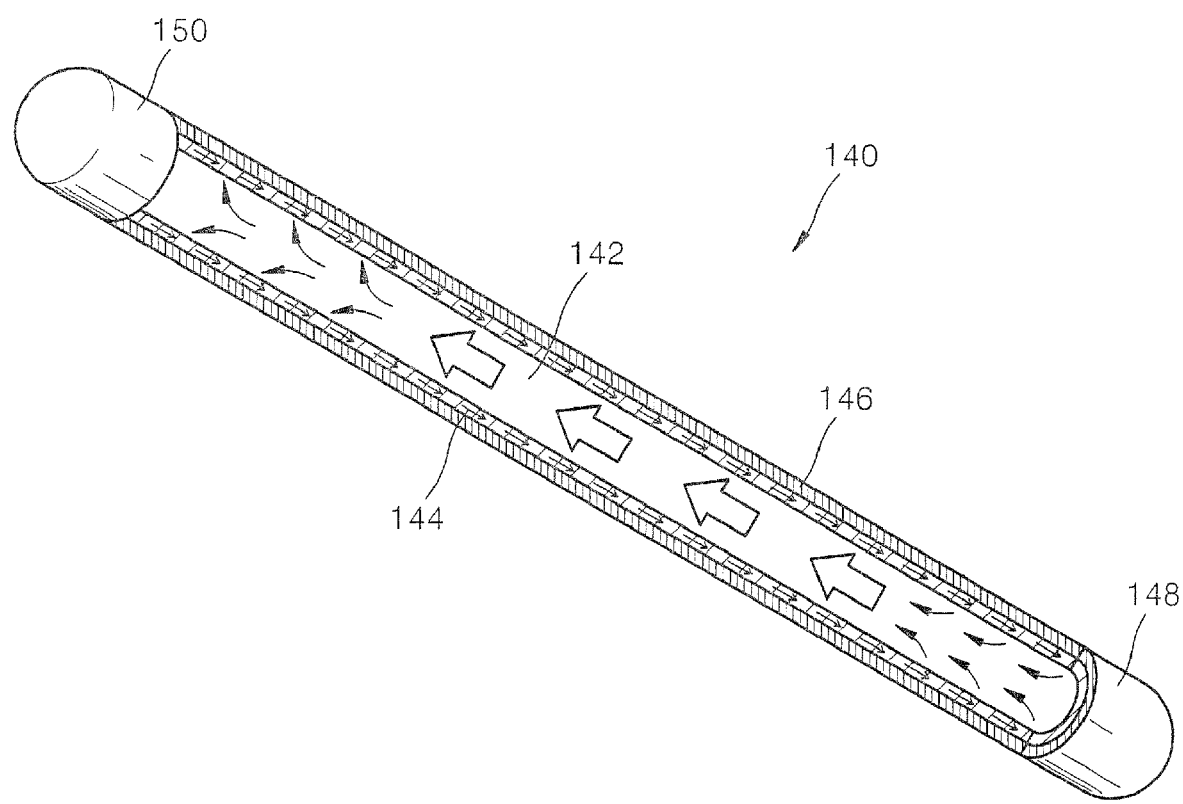
FIG. 16 is a perspective view of a micro heat pipe inserted into the cooling through-hole of FIG. 15.

FIG. 14 is a process flow chart illustrating a method of fabricating a WSP having a vertical heat emission path, according to still another embodiment of the present invention, FIG. 15 is a sectional view of a heat emission path formed according to the embodiment of FIG. 14, and FIG. 16 is a perspective view of a micro heat pipe inserted into the cooling through-hole in FIG. 16.

Referring to FIGS. 14 through 16, in the WSP according to this embodiment, a micro heat pipe 140 manufactured as shown in FIG. 16 is inserted to penetrate a cooling through-hole 120 and stacked semiconductor chips 108.

To fabricate the WSP having the vertical heat emission path according to this embodiment, a substrate 102 for the BGA including a printed circuit pattern 104 is prepared (S300) similar to the embodiment of FIG. 9. A first semiconductor chip having no cooling through-hole 120 is mounted to be electrically connected to the substrate 102 (S302). Subsequently, an evaporation unit 110 is stacked on the first semiconductor chip (S304). Other semiconductor chips 108 with the cooling through-hole 120 are stacked using the metal layer 124 of the embodiment of FIG. 9 or the bridge ring 128 of the embodiment of FIG. 11 (S306).

Subsequently, the stacked semiconductor chips 108 are aligned and connected (S308). When the stacked semiconductor chips 108 are aligned, the cooling through-holes 120 in each of the chips are aligned, thereby forming a cooling through-hole 120 that penetrates each of the stacked semiconductor chips 108 on the evaporation unit 110. Then, the micro heat pipe 140, already manufactured as shown in FIG. 16, is inserted into the cooling through-hole 120 (S310). Then, the cooling through-hole 120 at the top of the semiconductor chip 108 into which the micro heat pipe 140 is inserted is sealed by a condensation unit 126 (S312). The upper part of the substrate 102 and the semiconductor chips 108 are sealed by a molding process using sealing resin 114 (S314), and a solder ball 106 is attached below the substrate 102 (S316). The molding process may be performed so that the upper part of the condensation unit 126 is exposed outside the sealing resin 114, and subsequently a thermal interface material layer 116 and a cooling device 118 are attached to the condensation unit 126 (S318).

Referring to FIG. 16, the micro heat pipe 140 may include a micro heat pipe body 146, a first sealing cap 148, a second sealing cap 150, and a coolant (not shown). The micro heat pipe body 146 may include a central first through-hole 142 and micro holes 144 formed on the circumference of the first through-hole 142. The first sealing cap 148 seals a lower part of the micro heat pipe body 146 and the second sealing cap 150 seals an upper part of the micro heat pipe body 146. The coolant is thus contained inside the sealed micro heat pipe body 146.

FIG. 17 is a process flow chart illustrating a method of fabricating a WSP having a vertical heat emission path formed according to a modification of the embodiment of FIG. 14. According to this modified embodiment, the semiconductor chips 108 are first stacked and connected, and then the cooling through-hole 120 and the micro holes 122 are made in the stacked semiconductor chips 108 by LASER drilling and the micro heat pipe 140 is inserted.

Referring to FIG. 17, to fabricate the WSP having the vertical heat emission path, a substrate 102 for the BGA including a printed circuit pattern 104 is prepared (S300), similar to the embodiment of FIG. 9. A first semiconductor chip having no cooling through-hole 120 is mounted to be electrically connected to the substrate 102 (S302). Subsequently, an evaporation unit 110 is stacked on the first semiconductor chip (S304). Then, a number of other semiconductor chips 108 having no cooling through-hole 120, like the first semiconductor chip, are stacked on the first semiconductor chip on which the evaporation unit 110 is stacked (S320). Subsequently, the stacked semiconductor chips are aligned and connected (S308). Then, the cooling through-hole 120 is formed through the stacked semiconductor chips by LASER drilling. Subsequently, the micro heat pipe 140, already manufactured as shown in FIG. 16, is inserted into the cooling through-hole 120 (S310).

Then, the cooling through-hole 120 at the top of the semiconductor chip 108 into which the micro heat pipe 140 is inserted is sealed by a condensation unit 126 (S312). The upper part of the substrate 102 and the semiconductor chips 108 are sealed by a molding process using sealing resin 114 (S314), and a solder ball 106 is attached below the substrate 102 (S316). The molding process may be performed so that the upper part of the condensation unit 126 is exposed outside the sealing resin 114, and subsequently a thermal interface material layer 116 and a cooling device 118 are attached to the condensation unit 126 (S318).

As described above, in accordance with the present invention, the cooling through-hole is formed vertically through the stacked semiconductor chips in the WSP, and the micro heat pipe creates a cooling path, thereby reducing the temperature difference caused by the heat generated by the semiconductor chips and quickly dissipating a large amount of heat during the operation of the WSP. Consequently, the thermal reliability of the WSP is improved.

The present invention provides a WSP having a vertical heat emission path, comprising: a substrate on which semiconductor chips are mounted; two or more semiconductor chips being vertically stacked on the substrate; an evaporation unit positioned on the lowest semiconductor chip being stacked; a cooling through-hole penetrating the second and subsequent semiconductor chips stacked on the evaporation unit; a condensation unit positioned on the top of the semiconductor chips and sealing an upper part of the cooling through-hole; and a coolant filling a cooling path sealed by the evaporation unit, the cooling through-hole and the condensation unit.

In an embodiment, the space between the semiconductor chips through which the cooling through-hole is formed and the condensation unit may be sealed by metal connection using a metal layer.

In an embodiment, the cooling through-hole may further comprise a plurality of micro holes formed on the circumference of the cooling through-hole and having a smaller diameter than the cooling through-hole.

In an embodiment, the space between the semiconductor chips through which the cooling through-hole is formed and the condensation unit may be sealed by a bridge ring composed of insulating material.

The two or more semiconductor chips may further comprise a via contact which penetrates the semiconductor chips and is electrically connected to the substrate, and the WSP may further comprise sealing resin for sealing an upper part of the substrate and the semiconductor chips, and a solder ball below the substrate.

The condensation unit may be connected so that its upper surface is exposed outside the sealing resin, and the condensation unit may further comprise a thermal interface material (TIM) layer positioned on the condensation unit and a cooling device formed on the TIM layer. The cooling device may be one of a heat spreader, a heat sink, a material producing a Peltier effect and a cooling fan.

The present invention also provides a wafer stacked semiconductor package (WSP) having a vertical heat emission path, comprising: a substrate on which semiconductor chips are mounted, two or more semiconductor chips stacked vertically on the substrate; a cooling through-hole penetrating the second and subsequent semiconductor chips; and a micro heat pipe being inserted into the cooling through-hole, the micro heat pipe including a micro heat pipe body, a first sealing cap, a second sealing cap, and a coolant, wherein the micro heat pipe body includes a central first through-hole and micro holes formed on the circumference of the first through-hole, the first sealing cap seals a lower part of the micro heat pipe body, the second sealing cap seals an upper part of the micro heat pipe body, and the coolant is present inside the sealed micro heat pipe body.

The WSP may further comprise an evaporation unit with its lower part contacting the first semiconductor chip and its upper part contacting the first sealing cap; and a condensation unit with its upper part exposed to the outside and its lower part contacting the second sealing cap.

According to another aspect of the present invention, there is provided a method of fabricating a wafer stacked semiconductor package (WSP) having a vertical heat emission path.

The present invention provides a method of fabricating a WSP having a vertical heat emission path, comprising: mounting a lowest first semiconductor chip on a substrate and stacking an evaporation unit on the first semiconductor chip; stacking other semiconductor chips including a cooling through-hole on the first semiconductor chip; aligning and connecting the first semiconductor chip and the other semiconductor chips; forming a plurality of micro holes around the circumference of the cooling through-hole of the other semiconductor chips; and forming a condensation unit on the other semiconductor chips and injecting a coolant.

In an embodiment, the first semiconductor chip may not include the cooling through-hole, the evaporation unit and the condensation unit may be metal plates which have a high thermal conductivity, and the forming of the cooling through-hole and the micro holes may be performed by LASER drilling.

In an embodiment, the first semiconductor chip and the other semiconductor chips may be ones selected from a memory device, a microprocessor, and a microcontroller, the injecting of the coolant may be performed to fill the inside of the cooling through-hole to within the range of 30 to 90%, and after the injecting of the coolant, the inside of the cooling through-hole may be in a vacuum state.

The first semiconductor chip and the other semiconductor chips may have polished bottom surfaces and are within the range of about 10 to about 90 µm in thickness.

In an embodiment, the aligning and connecting of the first semiconductor chip and the other semiconductor chips may comprise: aligning the cooling through-hole where the metal layer is formed to be vertically connected; and metal-connecting the other semiconductor chips which are vertically positioned to be connected by the metal layer.

In another embodiment, the aligning and connecting of the first semiconductor chip and the other semiconductor chips may comprise: aligning the cooling through-hole to be vertically connected by inserting a bridge ring between the other semiconductor chips, the bridge ring including the same structure hole as the cooling through-hole; and connecting the sidewall of the cooling through-hole to be sealed, using an adhesive. The cooling through-hole and the micro holes may be round in shape.

The present invention provides a method of fabricating a WSP having a vertical heat emission path, comprising: mounting a first semiconductor chip on a substrate and stacking an evaporation unit on the first semiconductor chip; stacking other semiconductor chips including a cooling through-hole and a metal layer formed on an upper part of the cooling through-hole, on the evaporation unit; aligning and connecting the first semiconductor chip and the other semiconductor chips; inserting a micro heat pipe into the cooling through-hole being connected; and forming a condensation unit on the other semiconductor chips into which the micro heat pipe is inserted and sealing the condensation unit. The first semiconductor chip may not include the cooling through-hole.

In accordance with a modified example of the above embodiment, the method of fabricating the WSP having a vertical heat emission path may comprise inserting a micro heat pipe into the cooling through-hole after aligning and connecting the other semiconductor chips.

The micro heat pipe may comprise: a micro heat pipe body including a central first through-hole and micro holes formed on the circumference of the first through-hole; a first sealing cap for sealing a lower part of the micro heat pipe body; a second sealing cap for sealing an upper part of the micro heat pipe body; and a coolant inside the sealed micro heat pipe body sealed by the first and second sealing caps.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A wafer stacked semiconductor package (WSP) having a vertical heat emission path, comprising:
   a substrate;
   at least two semiconductor chips vertically stacked on the substrate, the at least two semiconductor chips including a lowest semiconductor chip and a second semiconductor chip stacked on the lowest semiconductor chip;
   an evaporation unit positioned on the lowest semiconductor chip;
   a cooling through-hole penetrating the second and any subsequent semiconductor chips stacked on the evaporation unit;
   a condensation unit positioned on a top of an uppermost semiconductor chip of the at least two semiconductor chips and sealing an upper part of the cooling through-hole;
   a plurality of micro holes contacting the cooling through-hole and having a smaller diameter than the cooling through-hole; and
   a coolant filling a cooling path sealed by the evaporation unit, the cooling through-hole, the micro holes, and the condensation unit.

2. The WSP of claim 1, wherein the at least two semiconductor chips further comprise a via contact which is electrically connected to the substrate and penetrates the semiconductor chips.

3. The WSP of claim 1, further comprising sealing resin for sealing an upper part of the substrate and the stacked semiconductor chips.

4. The WSP of claim 1, further comprising a solder ball attached below the substrate.

5. The WSP of claim 3, wherein the condensation unit has its upper surface exposed outside the sealing resin.

6. The WSP of claim 5, further comprising:
   a thermal interface material (TIM) layer formed on the condensation unit; and
   a cooling device formed on the TIM layer.

7. The WSP of claim 6, wherein the cooling device is one of a heat spreader, a heat sink, a material producing a Peltier effect, and a cooling fan.

8. The WSP of claim 1, wherein the cooling through-hole is formed in an area where significant heat is generated in the stacked semiconductor chips.

9. The WSP of claim 1, wherein the coolant is a liquid capable of evaporation and condensation.

10. The WSP of claim 1, wherein the space between the semiconductor chips through which the cooling through-hole is formed is sealed by metal connection.

11. The WSP of claim 1, wherein the semiconductor chips through which the cooling through-hole is formed and the condensation unit are sealed by metal connection.

12. The WSP of claim 1, wherein the space between the semiconductor chips through which the cooling through-hole is formed is sealed by a bridge ring comprising an insulating material.

13. The WSP of claim 1, wherein the semiconductor chips through which the cooling through-hole is formed and the condensation unit are sealed by a bridge ring comprising a metal.

* * * * *